United States Patent [19]

Duff et al.

[11] Patent Number: 5,245,527

[45] Date of Patent: Sep. 14, 1993

[54] MODULAR AC DRIVE CONTROLLER

[75] Inventors: David L. Duff; Nareshroy M. Patel, both of Ontario, Canada

[73] Assignee: Siemens Electric Limited, Brampton, Canada

[21] Appl. No.: 813,274

[22] Filed: Dec. 24, 1991

[51] Int. Cl.⁵ .................. H02M 7/537; F21V 21/00
[52] U.S. Cl. .................. 363/131; 363/141; 363/144; 361/610; 361/614; 361/690; 361/725
[58] Field of Search .................. 363/95, 97, 98, 131, 363/141, 144, 146; 361/381, 391, 393, 394, 340, 342, 331, 380

[56] References Cited

U.S. PATENT DOCUMENTS

| | | | |
|---|---|---|---|
| 3,721,890 | 3/1973 | Ettinger et al. | 363/144 |
| 4,015,173 | 3/1977 | Nitsche | 361/388 |
| 4,691,274 | 9/1987 | Matouk et al. | 363/141 |
| 4,972,296 | 11/1990 | Chu | 361/340 |
| 4,992,925 | 2/1991 | Meyer | 363/141 |

FOREIGN PATENT DOCUMENTS

| | | |
|---|---|---|
| 9107692 | 8/1991 | Fed. Rep. of Germany . |
| 2214731 | 9/1989 | United Kingdom . |
| 2242580 | 10/1991 | United Kingdom . |

*Primary Examiner*—Steven L. Stephan
*Assistant Examiner*—Adolf Berhane
*Attorney, Agent, or Firm*—Jacobson, Price, Holman & Stern

[57] ABSTRACT

An ac drive controller including a phase assembly for each phase of a polyphase supply to a motor, each phase assembly including an invertor module and a corresponding filter module. The electrical interconnections between each filter module and each invertor module occur through electrically conductive clips and corresponding bus bars to which the electronic switching devices in the invertor are also connected. The filter and invertor module interconnections are located as close as possible to the points where the electronic switching devices are connected to the buses to minimize stray reactances while allowing for simplified assembly and servicing of the controller.

14 Claims, 6 Drawing Sheets

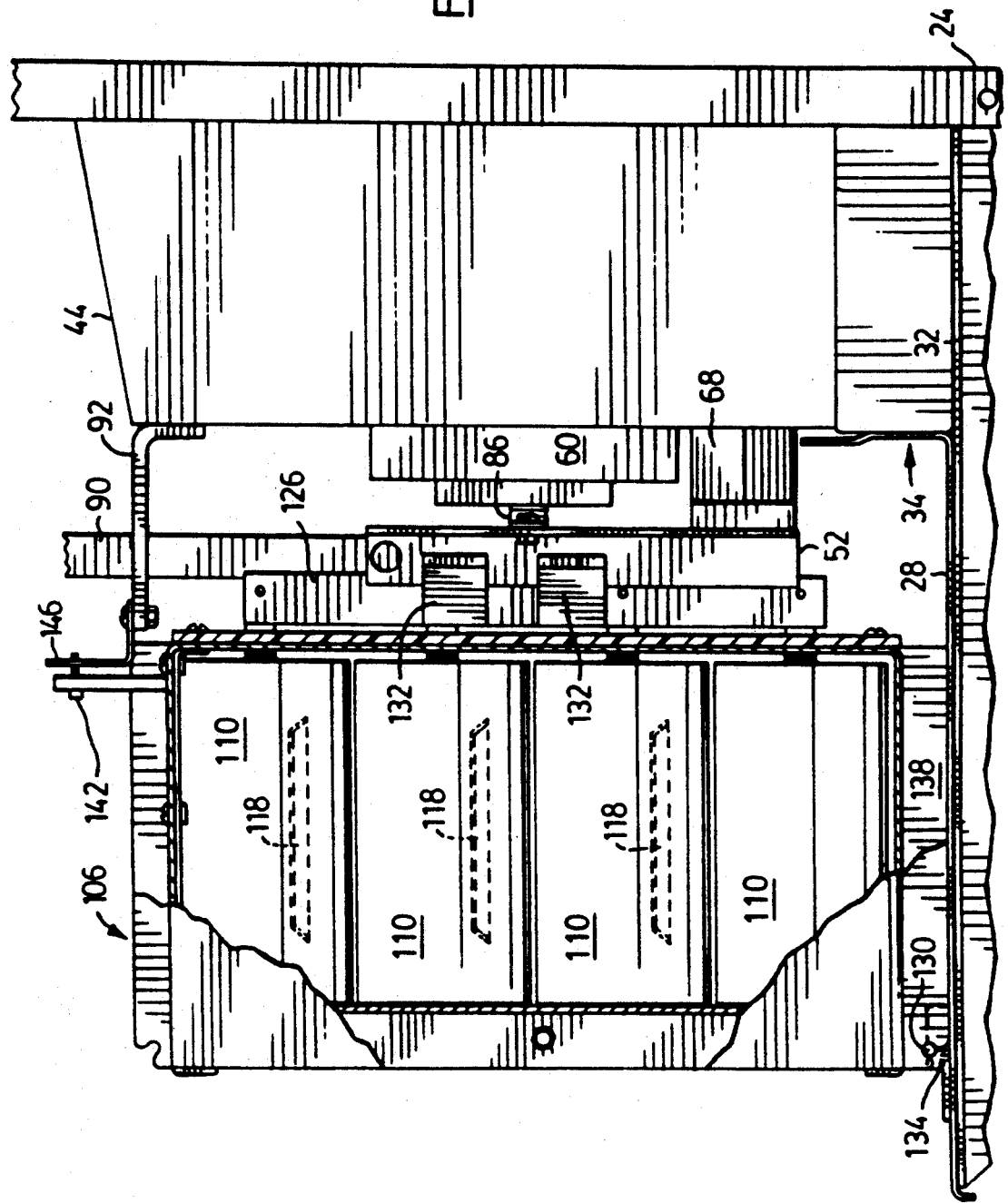

MODULAR AC DRIVE CONTROLLER

FIELD OF THE INVENTION

The present invention relates to ac drive controllers and specifically to a modularly constructed ac drive controller and modular components therefor.

BACKGROUND OF THE INVENTION

The speed of an ac motor is directly proportional to the frequency of the alternating current (ac) power supplied to it. Thus, when it is required to alter the speed of an ac motor, the frequency of the ac power supplied to it must be varied.

Typically, such variation is provided by a drive controller which includes three principal components: a power convertor assembly to convert the fixed-frequency ac power supplied to the drive controller into direct current (dc) power; a power invertor to invert the dc power from the convertor into polyphase ac power which is supplied to the motor; and a control assembly which controls the power invertor assembly to vary the frequency of the ac power supplied by the invertor, and hence the speed of the motor.

Drive controllers are continually being developed which offer improvements in the size of the motors which can be controlled, the range of available speeds, the efficiency of the controller, etc.

It is an object of the present invention to provide a novel, modularly constructed AC Drive Controller and modular components therefor.

SUMMARY OF THE INVENTION

According to the present invention, there is provided an ac drive controller comprising: a power convertor to convert ac power supplied to the convertor into negative and positive dc voltages; a plurality of invertor modules each being electrically connected to said power convertor to receive said positive and negative dc voltages and supplying an ac output voltage constituting one phase of a multiphase supply, each invertor module including at least first and second electronic switching devices, said first electronic switching device being connected between said negative dc voltage and said one phase and said second electronic switching device being connected between said positive dc voltage and said one phase, said first and second switching devices being responsive to control signals to supply alternately said negative and positive dc voltages to said one phase; a filter module removably connected between said negative and positive dc voltages in close proximity to the point where said negative and positive dc voltages are connected to said first and second electronic switching devices respectively such that stray reactance introduced by said connections is minimized; and a control module operable to supply said control signals to each invertor module.

Preferably, the interconnections between the invertor modules and the filter modules are made by way of electrically conductive clips mounted on the filter module and operable to removably engage the invertor module. It is also preferred that the connections between the electronic switching devices and the dc voltages and the output are resilient to isolate the electronic switching devices from mechanical forces applied to the dc voltage supplies or the output. It is also preferred that at least two clips be employed to connect the filter modules to the negative and positive dc voltages.

According to another aspect of the present invention, there is provided a phase assembly for use in an ac drive controller comprising: an invertor module to receive positive and negative dc voltages and supply an ac output voltage constituting one phase of a multiphase supply, said invertor module including means to receive a positive and a negative dc voltage, at least first and second electronic switching devices, said first electronic switching device being connected between said negative dc voltage and said one phase and said second electronic switching device being connected between said positive dc voltage and said one phase, said first and second switching devices being responsive to control signals to supply alternately said negative and positive dc voltages to said one phase; and a filter module removably connected between said negative and positive dc voltages in close proximity to the point where said negative and positive dc voltages are connected to said first and second electronic switching devices respectively such that stray reactance introduced by said connections is minimized.

According to yet another aspect of the present invention, there is provided a filter module for use in an ac drive controller comprising: a housing including at least one vent to allow cooling air to circulate through said housing; at least one electrical filter element; at least two electrically conductive clips in electrical communication with said electrical filter element, wherein each electrically conductive clip is operable to form a removable electrical connection between said at least one filter element and said ac drive controller, said housing supporting said electrically conductive clips and said vent being operable to support said electrical filter element.

BRIEF DESCRIPTION OF THE DRAWINGS

Preferred embodiments of the present invention will now be described, by way of example only, with reference to the attached figures wherein:

FIG. 5 shows a side view of an assembly of the filter module of FIG. 4 and the invertor module of FIG. 2 into a phase assembly;

DETAILED DESCRIPTION OF THE PREFERRED EMBODIMENTS

Figure 1:
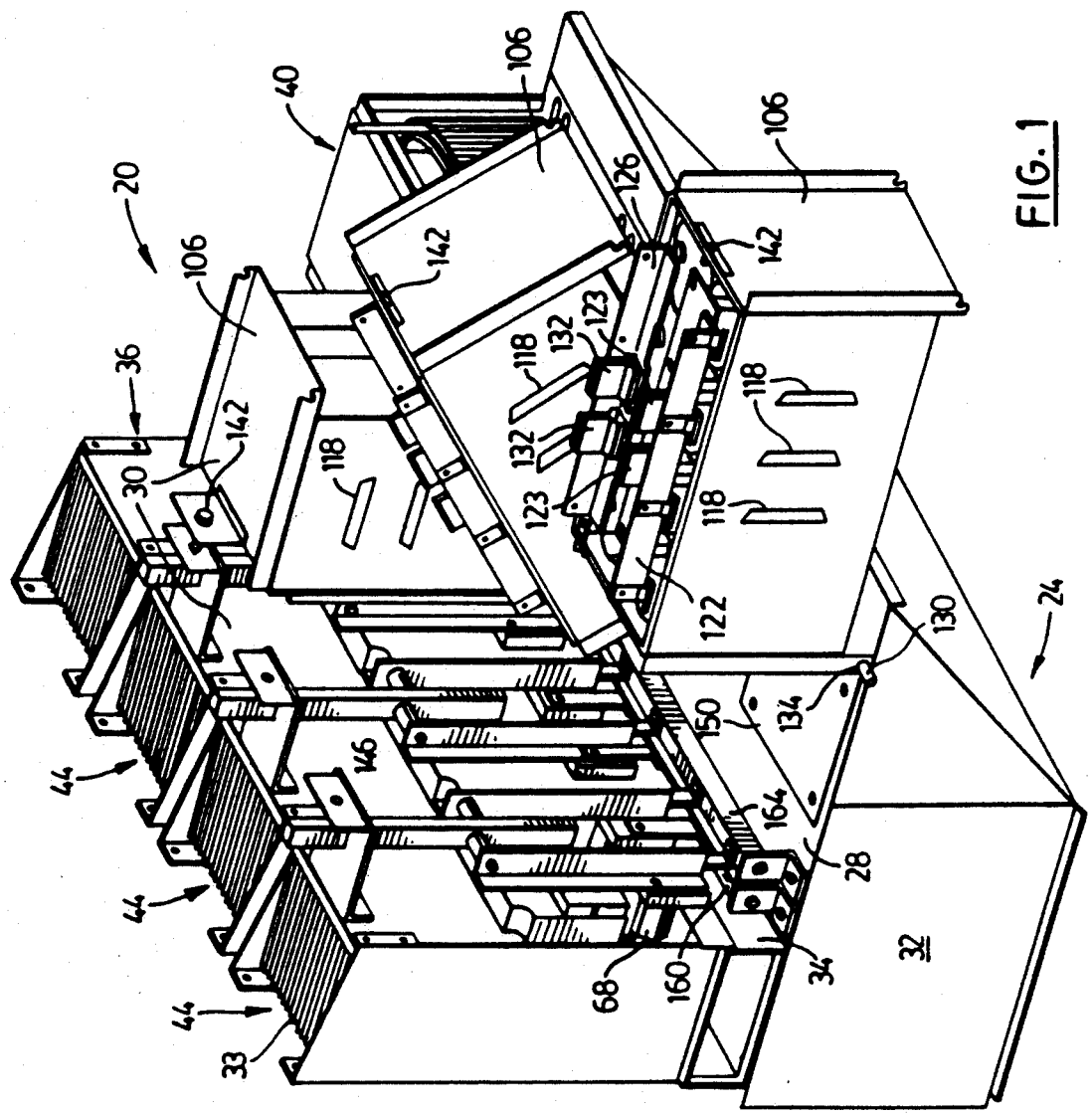
FIG. 1 shows a general perspective view of a partially assembled ac drive controller for a polyphase ac motor in accordance with the present invention.

Referring now to FIG. 1, an ac drive controller in accordance with the present invention is indicated generally at 20. The drive controller includes a base 24 with a mounting surface 28 and a plenum 32 for cooling air which is supplied by a circulating fan, not shown. The base 24 may be free standing or wall mounted as desired.

A power convertor module 36 and its associated choke 40 are mounted at one end of mounting surface 28. As will be understood by those of skill in the art, power convertor module 36 is connected to a source of ac power, typically 3 phase, and converts that ac power into negative and positive dc voltages of equal magnitude. Choke 40 is used to filter the dc voltages produced by the convertor module 36 to reduce non-dc components.

Three phase assemblies 30 are shown, each comprising an invertor module 44 and a filter module 106. The invertor modules 44 are shown mounted on mounting surface 28 in a laterally spaced arrangement in line with convertor module 36. As is understood by those of skill in the art, each phase assembly 30 provides an ac output constituting one phase of a polyphase ac power supply for an ac motor.

Figure 2:
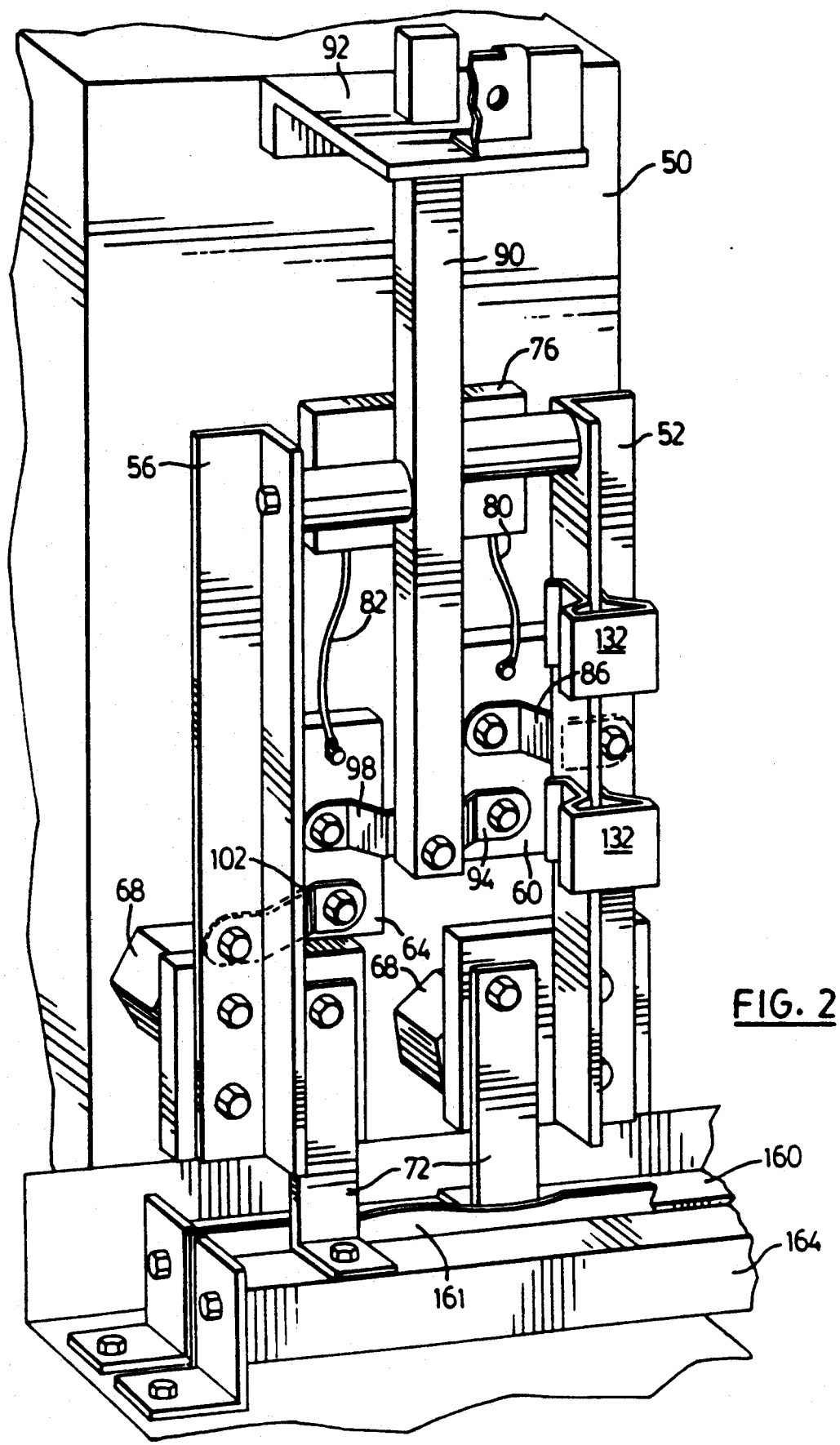
FIG. 2 shows a perspective view of the front of an invertor module used in the ac drive controller of FIG. 1.

FIG. 2 shows the front of an inverter module 44. Each invertor module 44 includes a rigid backplane 50 on which a pair of vertical, laterally spaced bus bars 52,56 via insulated spacers 68. Intermediate the bus bars 52,56 is an ac output bus 90, which is also mounted on the backplane 50 by insulating block 92. A gate driver circuit 76 is attached to the backplane 50 behind the output bus 90. The opposite side of backplane 50, most clearly shown in FIG. 1, includes several cooling fins 33 over which cooling air from plenum 32 may pass.

Suitable connection means, such as connection lugs 72, are provided for connecting the bus bars 52,56 to the respective negative and positive dc voltages supplied from the convertor module 36. These negative and positive dc voltages are distributed to each inverter module 44 via negative dc and a positive dc electrical buses, 160 and 164 respectively, which run along mounting surface 28 adjacent front plate 34. The two buses dc buses are separated by an insulating strip 161.

Each invertor module 44 also includes electronic switching devices 60,64 which are mounted to backplane 50 in a manner to provide good thermal contact between the electronic switching devices 60,64 and the backplane 50. In this manner, the electronic switching devices 60,64 are cooled by passing air through the fins to maintain them within their desired operating temperature range. In the preferred embodiment, these electronic switching devices are Insulated Gate Bipolar Transistors (IGBTs) however, it should be understood that any suitable electronic switching device may be employed.

As can be seen most clearly in FIG. 2, the emitter of IGBT 60 is connected to dc bus bar 52 by a connector 86. DC bus bar 52 is in turn connected to the negative dc bus from convertor module 36. Connector 86 is in the form of a resilient, relatively thin and wide copper band, and acts to isolate IGBT 60 from mechanical forces applied to bus 52 as will be described later. The collector of IGBT 60 is connected to ac output bus 90 bus by another resilient connector 94, similar to connector 86, which acts to isolate IGBT 60 from mechanical forces applied to ac output bus 90. The gate (base) of IGBT 60 is connected to the gate driver circuit 76 by lead 80.

In a similar manner, the emitter of IGBT 64 is connected to ac output bus 90 by resilient connector 98 and the collector of IGBT 64 is connected to dc bus bar 56 by resilient connector 102. DC bus bar 56 is in turn connected to the dc positive bus from convertor module 36. Connectors 98 and 102 serve to isolate IGBT 64 from mechanical forces applied to either ac output bus 90 or dc bus bar 56. The gate of IGBT 64 is connected to the gate driver circuit 76 by lead 82.

Figure 4:
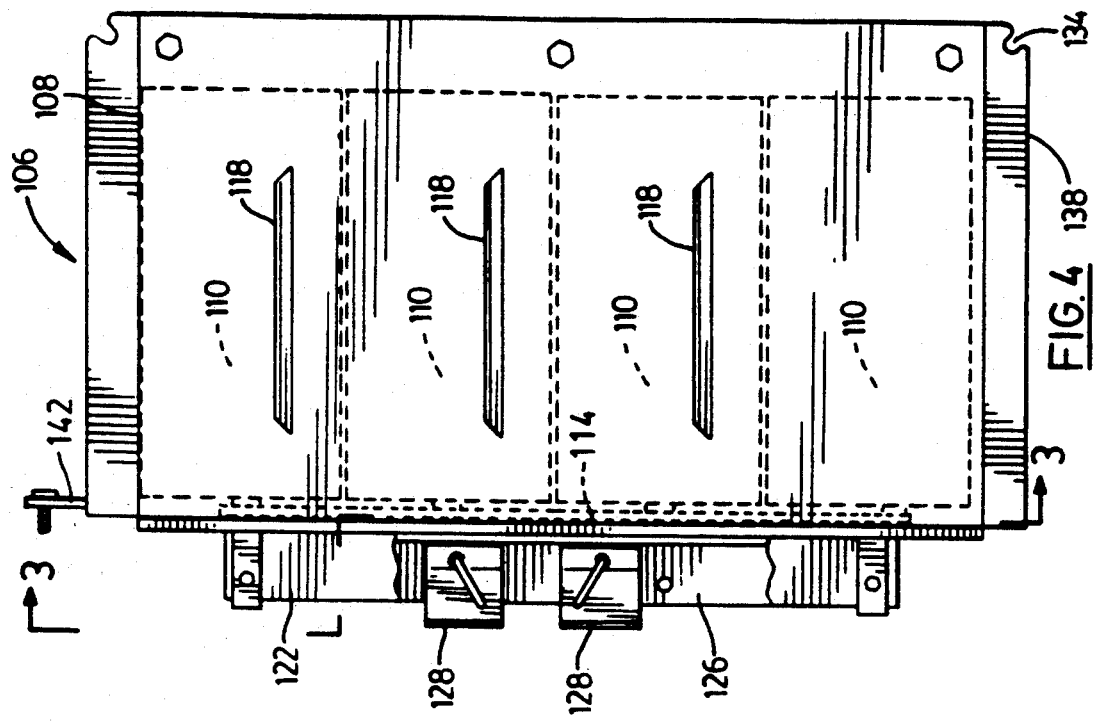
FIG. 4 shows a side view of the complete filter module of FIG. 3.
Figure 3:
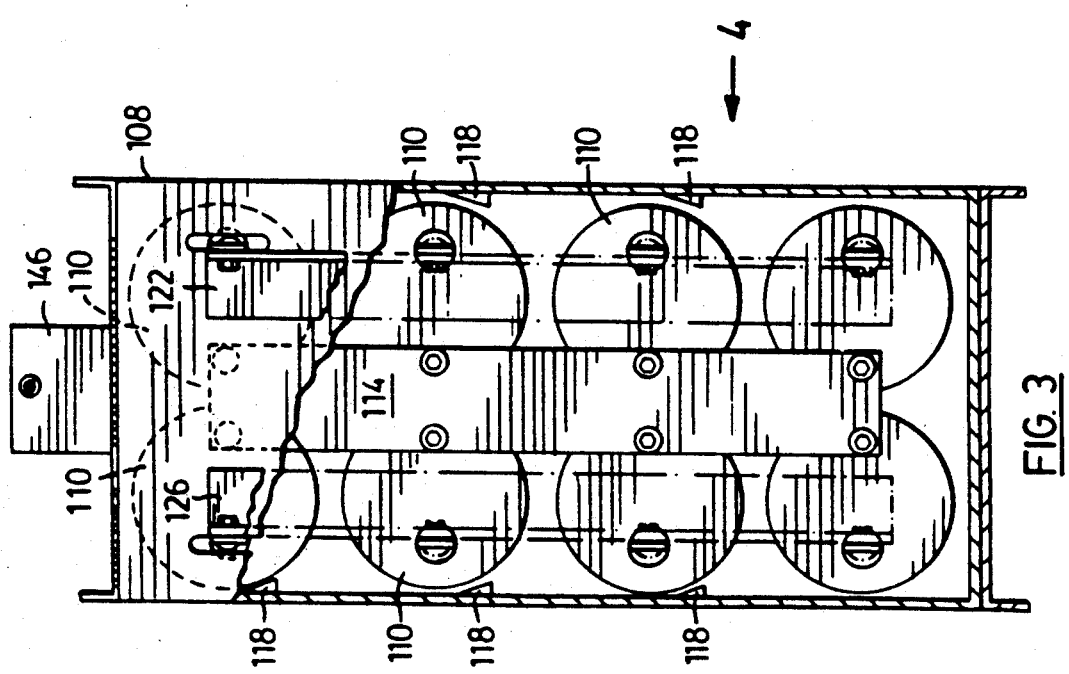
FIG. 3 shows a front, cut away view of a filter module used in the ac drive controller of FIG. 1.
Figure 6:
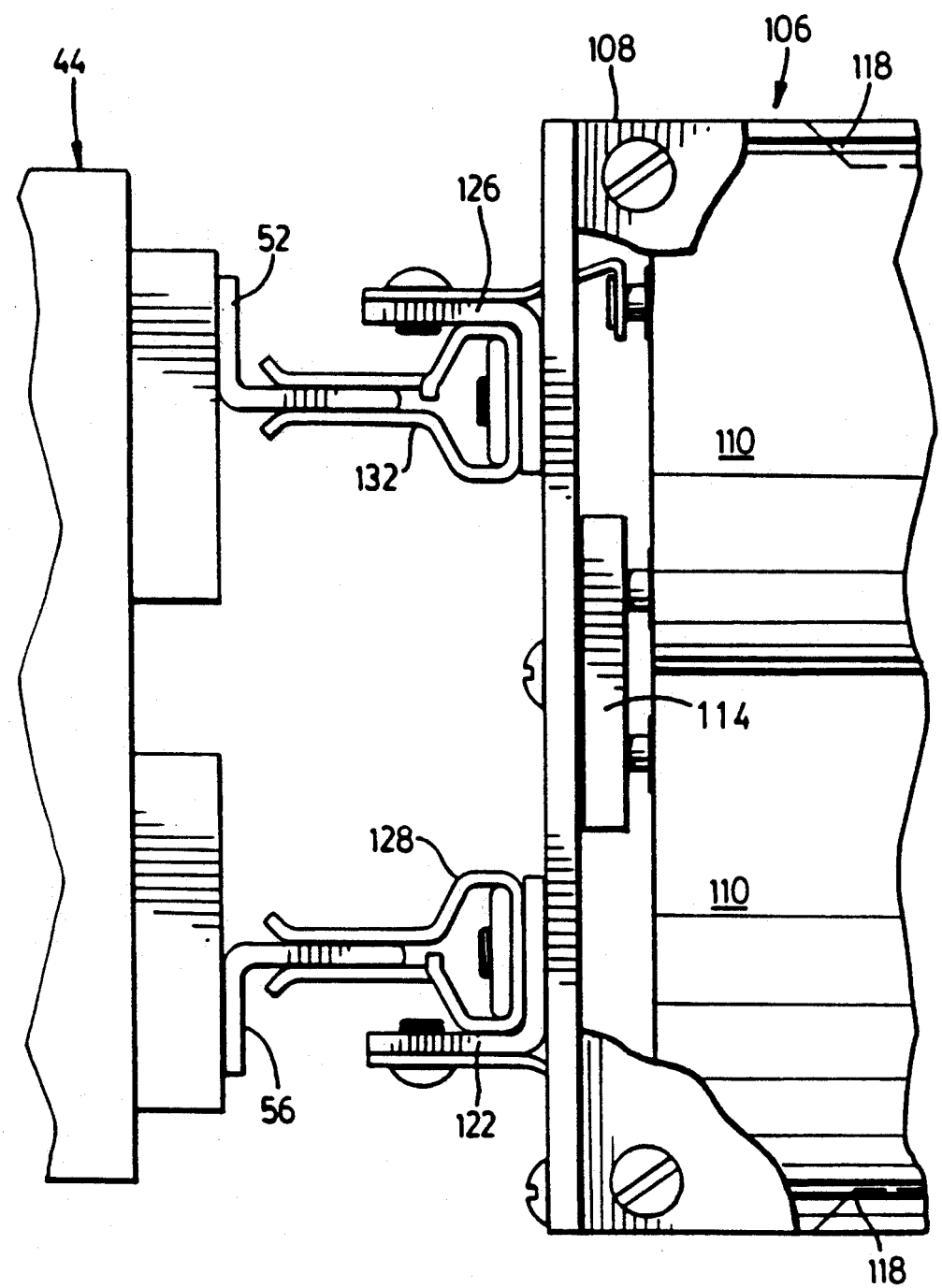
FIG. 6 shows a top plan view of a portion of the phase assembly of FIG. 5.

Removably connected to each invertor module 44 is a corresponding filter module 106. As best shown in FIGS. 4 and 5, each filter module 106 includes a housing 108 and a plurality of capacitors 110. Each capacitor 110 is connected in series with one other capacitor 110 by a connector 114. Each of these series pairs of capacitors 110 is supported within housing 108 by a pair of vent fins 118 formed in opposite walls of housing 108. As well as providing support for the pairs of capacitors 110, vent fins 118 also allow cooling air, whether actively supplied from plenum 32 or passively circulating, to circulate within housing 108.

Four of these series pairs of capacitors 110 are connected, in parallel, between a pair of filter buses 122,126 located on the front of the filter module 106. As will be understood by those of skill in the art, the number and the parallel/serial arrangement of capacitors 110 may be varied as required to provide the necessary filter capacitance and power handling capabilities. It will also be understood that inductive or resistive elements may be also connected between buses 122 and 126 if required.

Filter bus 126 has connected to it a pair of press-connectors 128 which are sized to engage the dc bus bar 52 of an invertor module 44. In a similar manner, filter bus 122 includes a pair of press-connectors 132 which are sized to engage dc bus bar 56 of an invertor module 44.

Referring again to FIG. 1, the filter modules 106 are mounted in a laterally spaced arrangement opposite invertor modules 44 and in line with choke 40. Each filter module 106 has a corresponding mounting plate 150. These mounting plates are attached to mounting surface 28 and each mounting plate includes a pivot rail 130 which is arranged to be parallel to invertor modules 44. Each mounting plate 150 is attached to mounting surface 28 such that a degree of tolerance is provided to allow the final alignment of any particular invertor module 44 with any particular filter module 106. In this manner, assembly tolerances for the invertor modules 44 and filter modules 106 are somewhat relaxed.

As seen in FIGS. 1 and 4, each filter module 106 includes a pair of locating slots 134 in each of a pair of depending support flanges 138. These locating slots 134 are sized to engage pivot rail 130 as shown in FIG. 1 and allow the filter modules 106 to be pivoted from a horizontal installation position to a vertical operational position.

As the filter module 106 is pivoted about the rail 130 to the upright operational position, press-connectors 128 and 132 are brought into electrical engagement with dc bus bars 56 and 52 respectively of the corresponding invertor module 44. The pivoting of the filter modules 106 about pivot rail 130 provides a mechanical advantage thus easing assembly.

A simple twist latch, best shown in FIG. 5, is used to secure a filter module 106 to its corresponding invertor module 44. One half of the latch 142 is mounted to the top surface of housing 108 and the other half of the latch 146 is mounted on backplane 50 via insulating block 92. The combination of the action of the latch and the action of the pivot rod and locating slots 134 operates to maintain a rigid connection between the two modules 44,106.

In operation, ac power is supplied to convertor module 36 where it is converted to positive and negative dc voltages. These positive and negative dc voltages are supplied to the respective dc bus bars 52,56 of each invertor module 44 via the convertor's electrical buses (not shown). Each phase assembly 30 provides an ac output constituting a single phase of a polyphase ac supply for an ac motor. Accordingly, the gate driver circuit 76 in each invertor module receives appropriate control signals from a control module (not shown) and biases the IGBTs accordingly to connect alternately the negative and positive dc bus bars 52,56 of the invertor module to the ac output bus 90. Depending upon the switching speed of the IGBTs, the frequency of the ac power produced at ac output bus 90 can be varied. The construction and operation of such control modules is well known to those of skill in the art and is therefore not described herein.

As is known by those of skill in the art, high speed switching of electronic switching devices in power invertors, such as invertor module 44, leads to undesirable transient voltages being impressed on the dc voltages supplied from convertors, such as convertor module 36. Consequently, filters are required to "stiffen" the dc buses to minimize the transient voltages produced by the switching. Typically, electrolytic capacitors are employed to filter the transients from the dc supply buses.

When high speed, high power switching is required, as in ac drive controllers, two problems exist relating to the filtering of the transients produced on the dc supply buses. Firstly, due to the relatively high voltage levels present on the dc supply buses, capacitors with the required voltage handling capabilities are physically quite large, and in fact, typically two or more capacitors are required to be connected in series and/or parallel to meet the voltage handling requirements. Accordingly, the large size of the capacitors can lead to difficult construction and servicing of the drive controller by obstructing easy access to the other components of the drive controller. These physical constraints can also lead to difficulty in providing proper cooling to temperature sensitive components.

Secondly, due to the high switching rates of the IGBTs or other electronic switching devices, the capacitors must be located as close as possible to the IGBTs to minimize the stray reactance introduced by the length of the leads connecting the capacitors to the IGBTs. Any such stray reactance will act to limit the switching rate of the IGBTs.

As will be understood by those of skill in the art, any such limitation of the switching rate is undesirable. Specifically, if the rate at which the IGBTs switch off is limited by stray reactances, a short circuit may be temporarily produced between the two dc bus bars 52,56 as one IGBT switches on before the other IGBT has completely switched off. Such a short circuit may result in very large over-voltages being briefly applied across the IGBTs. Such large over-voltages may damage or destroy the IGBTs, or other electronic switch devices used, and thus must be avoided.

Therefore, the resulting requirement to minimize the length of the leads from the capacitors further compounds the above-described first problem in that even if the necessary capacitor elements can be connected in such a manner to minimize stray reactance while still providing a "stiff" bus, the resulting physical placement of the capacitors leads to an ac drive controller design which is difficult to construct and difficult to service once constructed.

The present invention overcomes these problems by employing the afore-described phase assemblies comprising invertor modules 44 and filter modules 106. Specifically, stray reactances are minimized by positioning press-connectors 128,132 on filter modules 106 such that they connect to dc bus bars 52,56 on invertor modules 44 at the same point that connectors 102 and 86 connect IGBTs 64 and 60 to those same dc bus bars 52,56. In this manner, the capacitors 110 are connected, effectively, directly to the IGBTs 64 and 60 with a minimum of stray reactance being introduced into the circuit. Furthermore, the use of the press-connectors 128,132 provides an electrical connection with a low ohmic drop and high current handling (ampacity).

Filter modules 106 may be easily removed by releasing the latch and pivoting the module back, about pivot rail 130, to a horizontal position. This allows easy replacement of a filter module 106 with another filter module 106 or, alternatively, allows easy access to the components of the corresponding invertor module 44.

IGBTs 60 and 64, or other electronic switching devices, may be quite fragile mechanically and thus are susceptible to damage resulting from the mechanical forces applied to them during the assembly of the filter module 106 to the invertor module 44. Specifically, significant mechanical forces may be applied to the dc bus bars 52,56 due to the pressure required to effect the "tight" friction fit of the press-connectors 128,132 to the dc bus bars 56,52. The resilient connectors 86,102 are therefore provided to mechanically isolate the IGBTs 60,64 from the mechanical forces applied to dc bus bars 52,56.

In a similar manner, resilient connectors 94 and 98 serve to isolate the IGBTs from mechanical forces applied to ac bus 90 when connecting the output bus 90 to the ac motor's power leads.

The modular design of the filter modules 106 and invertor modules 44 in each phase assembly 30 allows for relatively easy construction and servicing of the resulting drive controller and allows for cooling air to be easily circulated to temperature sensitive components. The use of standard modules reduces the diversity of the inventory which must be maintained by the manufacturer and reduces the required assembly time. Furthermore, testing procedures are simplified and statistical process control systems may be employed more easily.

While only one press-connector 128,132 is required for each filter bus, it has been found that by employing two press-connectors on each filter bus an improved self-aligning property is imparted to the connections between the filter module 106 and the invertor module 44. As mentioned above, additional alignment capabilities are provided in by attachment of mounting plates 150 to mounting surface 28.

Figure 7:
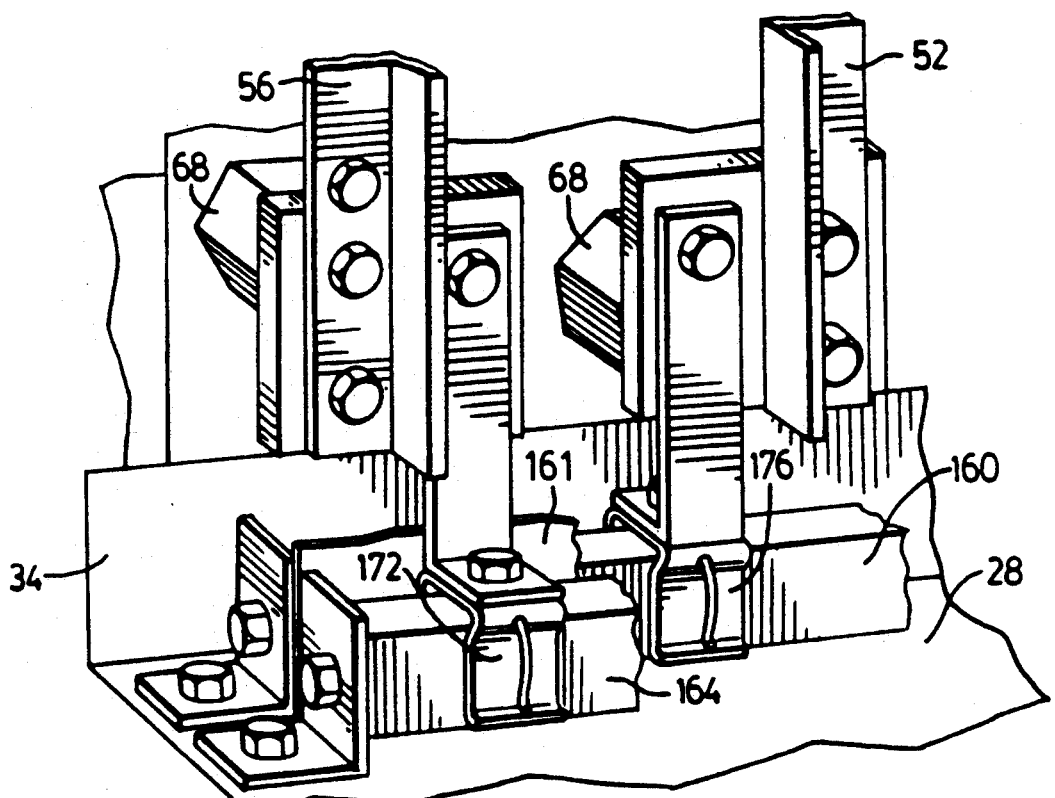
FIG. 7 shows a portion of a front plan view of another embodiment of an invertor module.

In another embodiment, the invertor modules 44 may be provided with press-connectors to connect their dc bus bars 52,56 to the dc supply buses from the convertor module 36. As shown in FIG. 7, the lower end of each dc bus bar 52,56 of each invertor module 44 has connected to it a press-connector, 172 and 176 respectively, each of which is sized to engage a respective dc bus bar 160,164.

When each invertor module 44 is mounted on mounting surface 28, the press connectors 172,176 each engage dc bus bars 164,160 respectively. It is contemplated that this will allow simplified installation/replacement of invertor modules 44 within the ac drive controller 20.

It should be understood that, while the preferred embodiment disclosed herein has three phase assemblies 30 to thus provide three phase power to an ac motor, applicant's invention is not limited to drive controllers with three phase assemblies. It is contemplated that, under various circumstances, it may be desired to operate polyphase ac motors requiring other than three phases and in such circumstances a number of phase assemblies corresponding to the required number of phases would be used.

In conclusion, the present invention provides several advantages over prior art ac drive controllers. The required filtering of switching transients on the dc buses is provided and stray reactance in the switching circuit are reduced. Also, the benefits of modular construction are available, including simplified construction, test and servicing procedures, and the capability to employ advanced manufacturing concepts such as Total Quality Control, Statistical Process Control and Cell Manufacturing. Cooling air is also easily provided to each module for temperature sensitive components.

Furthermore, it is also contemplated that as improvements such as new electronic switch devices and other components become available, existing drive controllers may be upgraded simply by replacing the convertor modules, invertor modules and/or filter modules with modules employing the new devices. Finally, as will be apparent, it is anticipated that servicing of the drive controller is greatly facilitated by the modular design with defective/damaged modules being replaced with new or refurbished modules and the damaged/defective modules be returned to the manufacturer for subsequent refurbishment. In some circumstances, such as at remote locations, the ease with which the modular components may be replaced may allow on-site servicing by end-users, rather than requiring specially trained service personnel.

We claim:

1. An ac drive controller comprising:
    a power convertor to convert ac power supplied to the power convertor into negative and positive dc voltages;
    a plurality of invertor modules each being electrically connected to said power convertor to receive said positive and negative dc voltages and supplying an ac output voltage constituting one phase of a multiphase supply, each invertor module including at least first and second electronic switching devices, said first electronic switching device being connected between said negative dc voltage and said one phase and said second electronic switching device being connected between said positive dc voltage and said one phase, said first and second switching devices being responsive to control signals to supply alternately said negative and positive dc voltages to said one phase;
    a filter for each invertor module removably connected between said negative and positive dc voltages;
    electrical connection means to connect releasably said filters to said dc voltages adjacent the point where said switching devices are connected to said dc voltages to minimize stray reactance introduced by the electrical connection between said filters and said switching devices; and
    a control module to supply said control signals to each invertor module.

2. An ac drive controller according to claim 1 wherein said electrical connection means comprise at least first and second electrically conductive clips and each invertor module includes a first bus bar receiving said negative dc voltage and a second bus bar receiving said positive dc voltage, said first and second electronic switching devices being connected between said respective bus bar and said one phase, said first and second electrically conductive clips electrically engaging said first and second bus bars 3. An ac drive controller according to claim 2 wherein at least two electrically conductive clips electrically engage said first bus bar and at least two different electrically conductive clips electrically engage said second bus bar.

4. An ac drive controller according to claim 3 wherein each of said at least two clips engage their respective first and second bus bars such that said electrically conductive clips straddle said points at which said electronic switching devices are connected to said bus bars.

5. An ac drive controller according to claim 2 wherein the connection between each of said first and second bus bars and said first and second electronic switching devices respectively is resilient to isolate said electronic switching devices from mechanical forces applied to said first and second bus bars when said electrically conductive clips are brought into engagement with said bus bars.

6. An ac drive controller according to claim 2 wherein said connections between each of said first and second electronic switching devices and said phase output are resilient to isolate said electronic switching devices from mechanical forces applied to said one phase.

7. An ac drive controller according to claim 2 wherein said bus bars are removably connected to said negative and positive dc voltages.

8. An ac drive controller according to claim 2 wherein each filter is pivoted about a fixed point to bring said electrically conductive clips into electrical engagement with said respective bus bars, the mechanical advantage associated with said fixed pivot point facilitating said electrical engagement.

9. An ac drive controller according to claim 1 further including a plenum to distribute forced cooling air to each invertor module.

10. A phase assembly for use in an ac drive controller comprising:
    an invertor module to receive positive and negative dc voltages and supply an ac output voltage constituting one phase of a multiphase supply, said invertor module including means to receive a positive and a negative dc voltage, at least first and second electronic switching devices, said first electronic switching device being connected between said negative dc voltage and said one phase and said second electronic switching device being connected between said positive dc voltage and said one phase, said first and second switching devices being responsive to control signals to supply alternately said negative and positive dc voltages to said one phase;
    a filter removably connected between said negative and positive dc voltages; and electrical connection means to connect releasably said filters to said dc voltages adjacent the point where said switching devices are connected to said dc voltages to minimize stray reactance introduced by the electrical connection between said filters and said switching devices.

11. A phase assembly according to claim 10 wherein said means to receive said positive and negative dc voltages are rigid bus bars.

12. A phase assembly according to claim 11 wherein said rigid bus bars are removably connected to said positive and negative voltages.

13. A phase assembly according to claim 10 further including means for receiving and distributing forced cooling air through at least a portion of said assembly.

14. A phase assembly according to claim 10 wherein said first and second electronic switching devices are connected to said rigid bus bars and said phase output by resilient connectors to isolate said first and second electronic switching devices from mechanical forces applied to said first and second electrical rigid bus bars and said phase output.

* * * * *